(12) United States Patent
Arita et al.

(10) Patent No.: US 10,485,131 B2
(45) Date of Patent: *Nov. 19, 2019

(54) POWER-SUPPLY DEVICE, LIGHT FIXTURE, AND VEHICLE

(71) Applicant: Panasonic Intellectual Property Management Co., Ltd., Osaka (JP)

(72) Inventors: Kosaku Arita, Niigata (JP); Masahiro Nishikawa, Niigata (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 147 days.

This patent is subject to a terminal disclaimer.

(21) Appl. No.: 15/656,453

(22) Filed: Jul. 21, 2017

(65) Prior Publication Data

US 2017/0325350 A1 Nov. 9, 2017

Related U.S. Application Data

(63) Continuation of application No. 14/499,919, filed on Sep. 29, 2014, now Pat. No. 9,750,154.

(30) Foreign Application Priority Data

Oct. 2, 2013 (JP) ................................ 2013-207584

(51) Int. Cl.
*H05K 7/14* (2006.01)
*F21S 41/00* (2018.01)
(Continued)

(52) U.S. Cl.
CPC ......... *H05K 7/1427* (2013.01); *B60Q 1/0094* (2013.01); *F21S 41/00* (2018.01);
(Continued)

(58) Field of Classification Search
CPC ...... H05K 7/1427; H05K 5/0247; H05K 5/03; H05K 7/1432; F21S 41/00; B60Q 1/0094; F21V 15/00; F21V 15/01; F21V 31/005
See application file for complete search history.

(56) References Cited

U.S. PATENT DOCUMENTS

| 5,584,559 A | * | 12/1996 | Toda | ...................... | B60Q 1/007 |
| | | | | | 362/265 |
| 5,608,611 A | | 3/1997 | Sudarek | | |

(Continued)

FOREIGN PATENT DOCUMENTS

| CN | 2365804 Y | 2/2000 |
| CN | 100408380 C | 8/2008 |

(Continued)

OTHER PUBLICATIONS

Office Action along with a Search Report for corresponding Chinese Application No. 201410520407.7, dated Sep. 28, 2017 (with English translation).

(Continued)

*Primary Examiner* — Bao Q Truong
(74) *Attorney, Agent, or Firm* — Renner, Otto, Boisselle & Sklar, LLP

(57) ABSTRACT

A power-supply device including: a casing having a space therein and formed by metal stamping or having a thickness ranging from 0.3 to 3.0 mm; and a circuit board disposed inside the casing, wherein the casing includes a casing portion having an opening, and a cover portion disposed to cover the opening of the casing portion, the casing portion has a through hole formed at a position corresponding to a connector terminal connected to the circuit board, and the cover portion includes a storage portion bulging outward from the casing, the storage portion storing either one of an electronic component provided to a face of the circuit board (Continued)

which faces the cover portion and an electronic component provided across the circuit board.

12 Claims, 10 Drawing Sheets

(51) Int. Cl.
    *B60Q 1/00* (2006.01)
    *H05K 5/02* (2006.01)
    *H05K 5/03* (2006.01)

(52) U.S. Cl.
    CPC ............ *H05K 5/0247* (2013.01); *H05K 5/03* (2013.01); *H05K 7/1432* (2013.01)

(56) References Cited

U.S. PATENT DOCUMENTS

| | | |
|---|---|---|
| 9,301,385 B2 | 3/2016 | Kurebayashi |
| 9,345,150 B2 | 5/2016 | Fukumasu |
| 9,480,181 B2 | 10/2016 | Lindkamp |
| 9,750,154 B2 * | 8/2017 | Arita .................... H05K 5/0247 |
| 2003/0161110 A1 * | 8/2003 | Spasevski ........... B60R 16/0239 361/715 |
| 2008/0144290 A1 | 6/2008 | Brandt et al. |
| 2009/0057006 A1 | 3/2009 | Kishibata |
| 2010/0157596 A1 * | 6/2010 | Wen ..................... F21V 31/005 362/235 |
| 2012/0262968 A1 | 10/2012 | Nagano |
| 2016/0167604 A1 | 6/2016 | Aida |

FOREIGN PATENT DOCUMENTS

| | | |
|---|---|---|
| CN | 202721931 | 2/2013 |
| EP | 1 806 960 A1 | 7/2007 |
| JP | 06-318790 | 11/1994 |
| JP | 2003-285002 | 10/2003 |
| JP | 2003-532301 | 10/2003 |
| JP | 2007-184428 | 7/2007 |
| JP | 2007-533518 | 11/2007 |
| JP | 2009-170359 | 7/2009 |
| JP | 2010-198781 | 9/2010 |
| JP | 2011-233595 | 11/2011 |
| JP | 2011-233595 A | 11/2011 |
| JP | 2012-228018 | 11/2012 |
| WO | WO 01/84898 A2 | 11/2001 |

OTHER PUBLICATIONS

Chinese Office Action and Search Report (with English Translation) dated Jun. 23, 2016 for corresponding Chinese Application No. 201410520407.7.

Chinese Office Action and Search Report (with English Translation) dated Mar. 16, 2017 for corresponding Chinese Application No. 201410520407.7.

Japan Office Action for corresponding Japanese Application No. 2013-207584, dated Jun. 6, 2017.

* cited by examiner

POWER-SUPPLY DEVICE, LIGHT FIXTURE, AND VEHICLE

CROSS REFERENCE TO RELATED APPLICATION

This application claims the benefit of priority of Japanese Patent Application Number 2013-207584, filed Oct. 2, 2013, the entire content of which is hereby incorporated by reference.

TECHNICAL FIELD

The disclosure relates to a power-supply device, a light fixture including the same, and a vehicle including the light fixture.

BACKGROUND ART

A discharge lamp device such as a headlamp including a discharge lamp, like a high intensity discharge (HID) lamp, as a light source uses a power-supply device (lighting circuit module) to control lighting of a discharge lamp.

Such a power-supply device includes: a lighting circuit (power circuit) for lighting a discharge lamp; and a circuit case (housing) that houses the lighting circuit. The power-supply device is often fixed to the outside of a lamp housing in a discharge lamp device (see Japanese Unexamined Patent Application Publication No. 2009-170359, for instance).

In this case, to electrically connect the lighting circuit in the circuit case and the discharge lamp in the lamp housing, a through hole that communicates with both the lamp housing and the circuit case is formed in each of the lamp housing and the circuit case. Moreover, a connector terminal that projects toward the lamp housing to face the through hole is connected to a circuit board of the lighting circuit. Furthermore, an input/output cable line (harness) is led out from the lamp housing, and is interested in the through holes of the lamp housing and the circuit case and connected to the connector terminal of the circuit board.

SUMMARY

In a conventional power-supply device, since a connector terminal is provided to a lamp housing of a circuit board, even when the power-supply device is fixed to the outside of the lamp housing, there is an advantage that the connector terminal is unlikely to be obstructive. In the power-supply device thus configured, however, since a circuit case is attached to the outside of the lamp housing, for example, a structure is adopted in which part of the circuit case is fit in a hole of the lamp housing. For this reason, it is necessary to reduce a height of a portion of the circuit case other than an attachment portion to the lamp housing (portion around the connector terminal).

In contrast, in the power-supply device, since almost all electronic components are mounted on one of faces of the circuit board (e.g. a face facing the lamp housing), when a relatively high electronic component such as a transformer is housed in the circuit case, it is necessary to heighten the circuit case to a certain degree.

As stated above, in the power-supply device in which the connector terminal is disposed in the lamp housing of the circuit board, it is difficult to simply make the circuit case thinner, and when the circuit case is heightened to provide a high electronic component such as a transformer to the circuit board, a wasted space is created between a low electronic component and the circuit case.

The disclosure has been conceived to solve such a problem, and an object of the disclosure is to provide a power-supply device or the like that allows for miniaturization of a housing that houses a circuit board.

In order to achieve the above object, a first power-supply device according to one aspect of the present invention includes: a casing formed by metal stamping and having a space therein; and a circuit board disposed inside the casing, wherein the casing includes a casing portion having an opening, and a cover portion disposed to cover the opening of the casing portion, the casing portion has a through hole formed at a position corresponding to a connector terminal connected to the circuit board, and the cover portion includes a storage portion bulging outward from the casing, the storage portion storing either one of an electronic component provided to a face of the circuit board which faces the cover portion and an electronic component provided across the circuit board.

Moreover, a second power-supply device according to another aspect of the present invention includes: a casing made of metal and having a thickness ranging from 0.3 to 3.0 mm and a space therein; and; and a circuit board disposed inside the casing, wherein the casing includes a casing portion having an opening, and a cover portion disposed to cover the opening of the casing portion, the casing portion has a through hole formed at a position corresponding to a connector terminal connected to the circuit board, and the cover portion includes a storage portion bulging outward from the casing, the storage portion storing either one of an electronic component provided to a face of the circuit board which faces the cover portion and an electronic component provided across the circuit board.

Furthermore, in the first and second power-supply devices in the foregoing aspects of the present invention, the through hole may be surrounded by a wall portion.

Moreover, in the first and second power-supply devices in the foregoing aspects of the present invention, when the cover portion is seen in a planar view, the storage portion and the wall portion may not overlap each other.

Furthermore, in the first and second power-supply devices in the foregoing aspects of the present invention, the electronic component may be a transformer.

Moreover, in the first and second power-supply devices in the foregoing aspects of the present invention, the cover portion may have a thickness ranging from 0.8 to 3.0 mm, and the casing portion may have a thickness ranging from 0.3 to 1.0 mm.

Furthermore, in the first and second power-supply devices in the foregoing aspects of the present invention, the circuit board may be fixed to the cover portion.

Moreover, in the first and second power-supply devices in the foregoing aspects of the present invention, the casing portion may include a body portion and a protruding portion, the protruding portion being part of a top face of the body portion that protrudes outward, and the through hole may be provided to a top face of the protruding portion.

Furthermore, in the first and second power-supply devices in the foregoing aspects of the present invention, a groove may be formed in an inner face of the cover portion to surround the circuit board.

A light fixture according to still another aspect of the present invention includes: a housing including a light extraction portion; a light source disposed inside the housing; and either one of the first power-supply device and the second power-supply device according to the foregoing aspects of the present invention that is disposed outside the housing and supplies power to the light source.

A vehicle according to yet another aspect of the present invention includes a vehicle body; and the light fixture according to still another aspect of the present invention.

According to the disclosure, it is possible to miniaturize a housing that houses a circuit board.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION

Hereinafter, exemplary embodiments of the disclosure will be described with reference to the drawings. It is to be noted that each of the subsequently-described embodiments show a specific preferred example of the disclosure. Therefore, numerical values, shapes, materials, structural components, the arrangement and connection of the structural components, as well as steps and the sequence of the steps, etc. shown in the following exemplary embodiments are mere examples, and are not intended to limit the scope of the present invention. Furthermore, among the structural components in the following exemplary embodiment, components not recited in any one of the independent claims which indicate the broadest concepts of the present invention are described as arbitrary structural components.

It is to be noted that the respective figures are schematic diagrams and are not necessarily precise illustrations. Furthermore, in the respective figures, substantially identical components are assigned the same reference signs, and overlapping description is omitted or simplified.

Embodiment 1

Figure 1A:
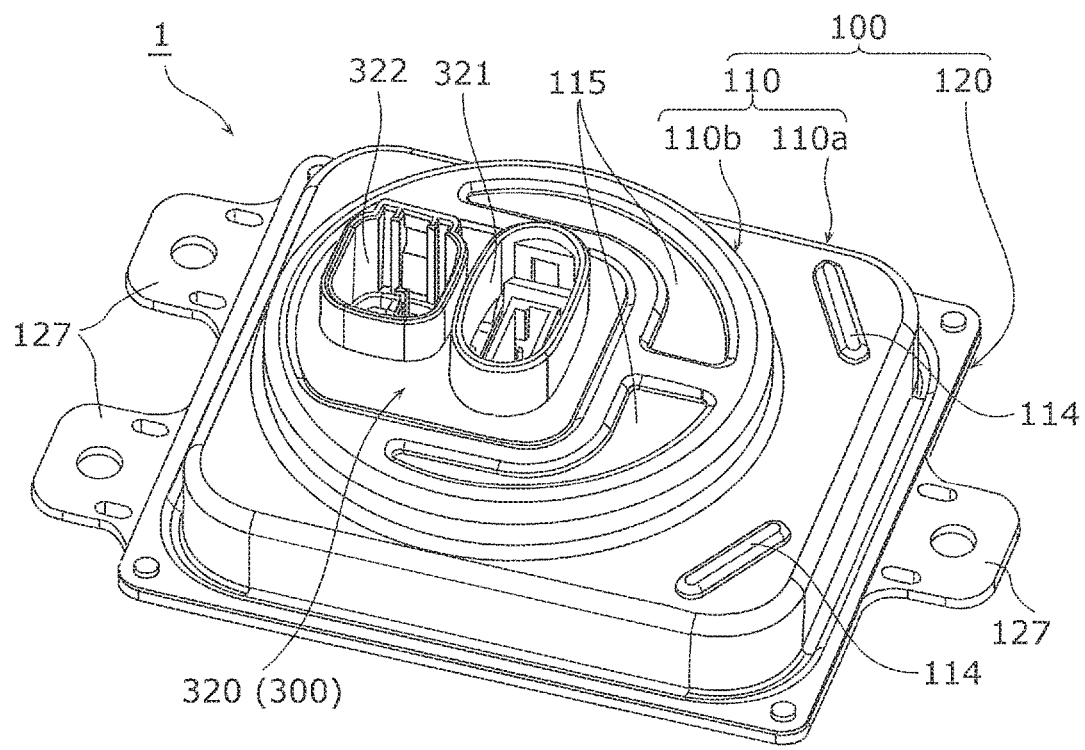
FIG. 1A is a perspective view when a power-supply device according to Embodiment 1 is viewed obliquely from above.
Figure 1B:
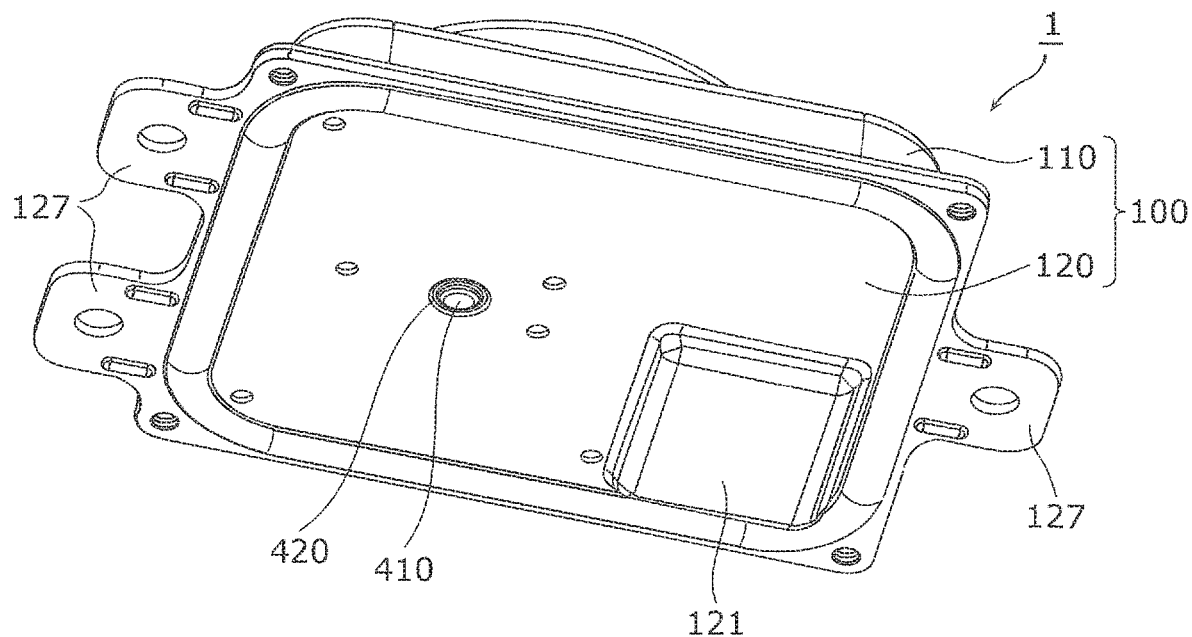
FIG. 1B is a perspective view when a power-supply device according to Embodiment 1 is viewed obliquely from below.
Figure 2:
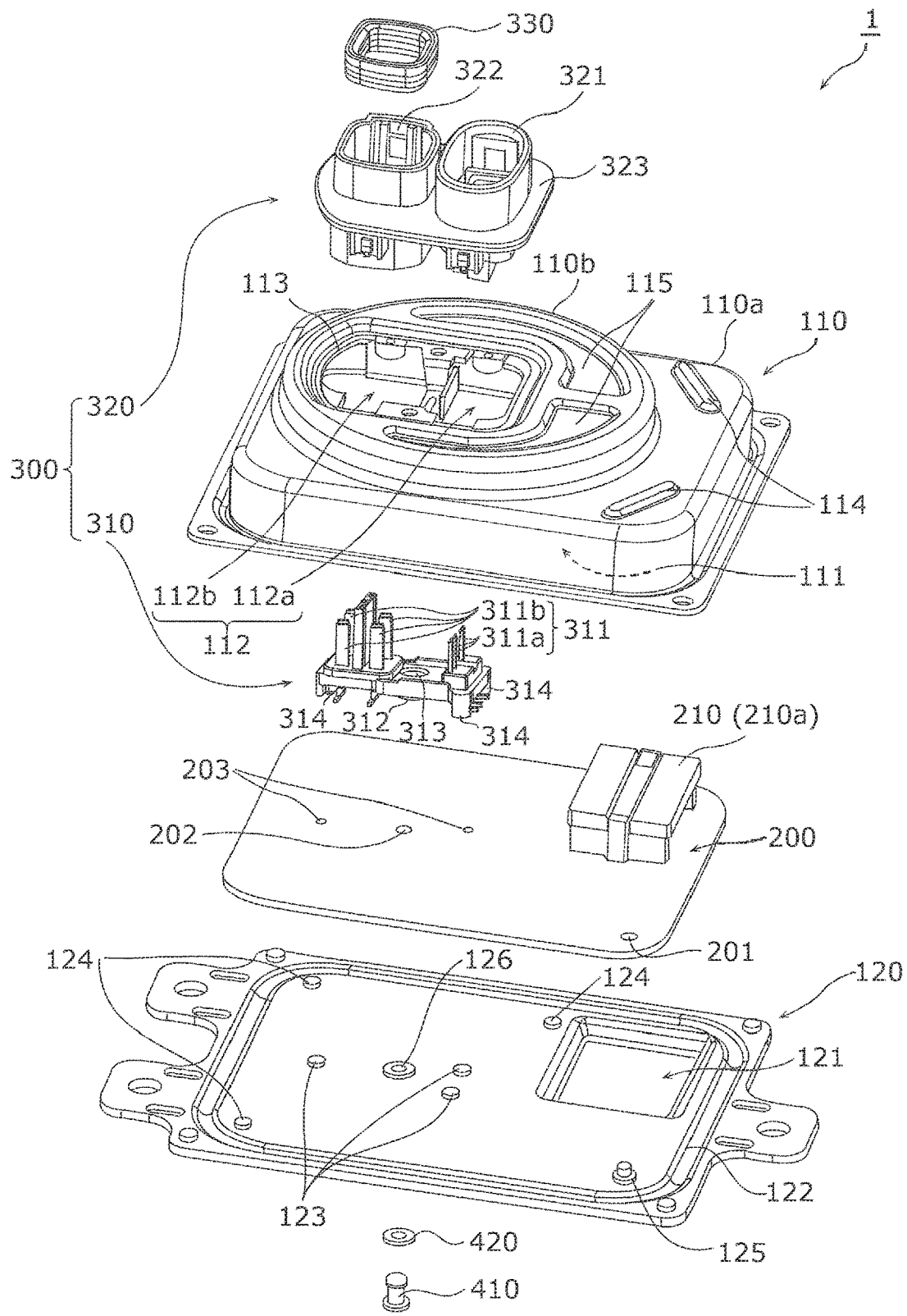
FIG. 2 is an exploded perspective view of a power-supply device according to Embodiment 1.
Figure 3:
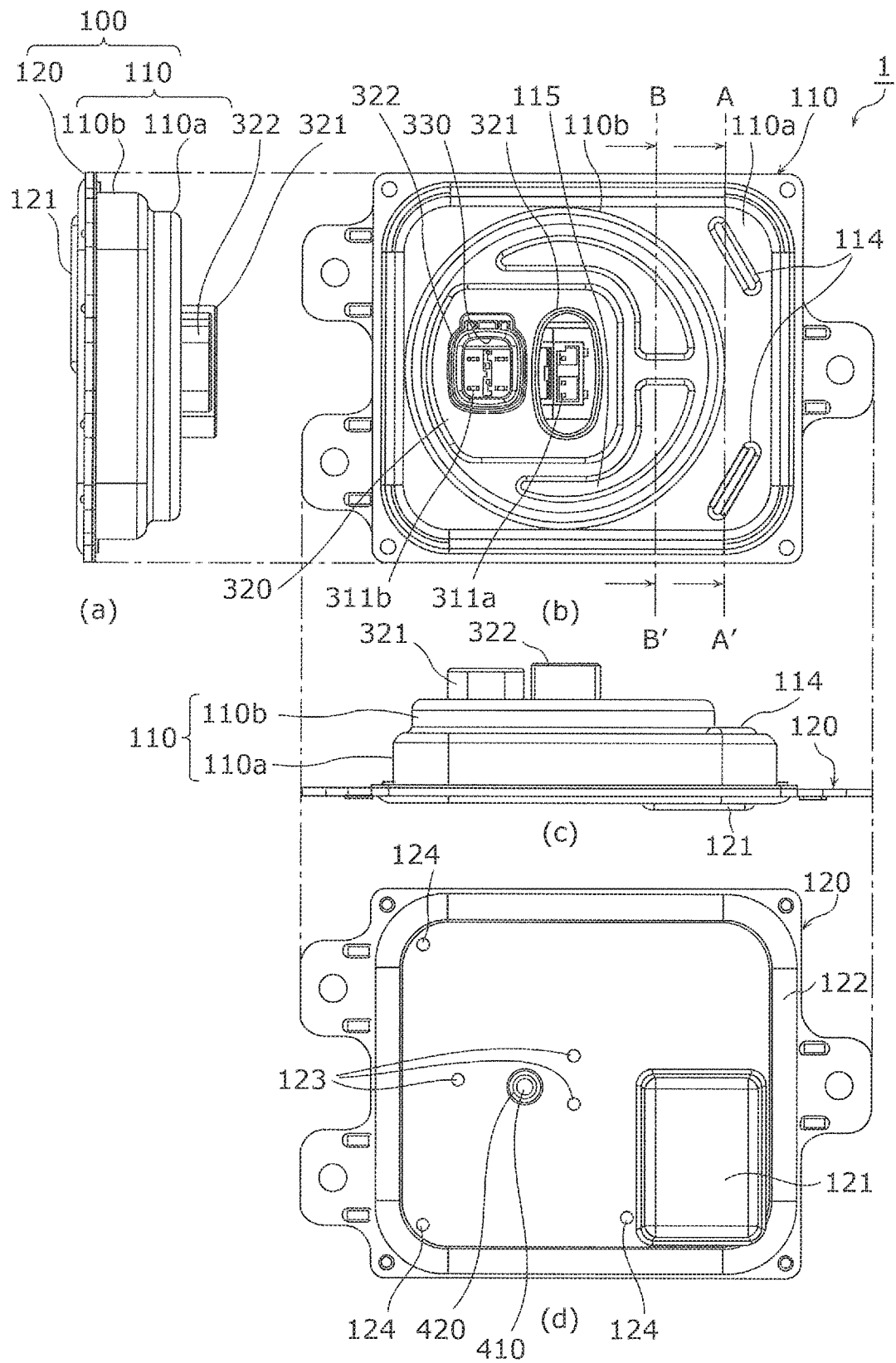
FIG. 3 is a diagram showing an outline of a power-supply device according to Embodiment 1, wherein (a) is a left lateral view, (b) is a top view, (c) is a front view, and (d) is a bottom view.

FIG. 1A is a perspective view when a power-supply device 1 according to Embodiment 1 is viewed obliquely from above. FIG. 1B is a perspective view when the power-supply device 1 is viewed obliquely from below. FIG. 2 is an exploded perspective view of the power-supply device 1. FIG. 3 is a diagram showing an outline of the power-supply device 1, wherein (a) is a left lateral view, (b) is a top view, (c) is a front view, and (d) is a bottom view.

The power-supply device 1 is a lighting circuit module (ballast) for turning ON an HID lamp used as a light source in a discharge lamp device such as a vehicular headlamp for example, and includes, as shown in FIG. 1A, FIG. 1B, FIG. 2, and FIG. 3, a casing 100 having a space therein, a circuit board 200 disposed inside the casing 100, an electronic component 210 provided to the circuit board 200, and a coupler 300.

In the power-supply device 1 in this embodiment, a storage portion 121 is provided to a cover portion (cover) 120 of the casing 100 so that the storage portion 121 bulges outward from the casing 100. The storage portion 121 stores the electronic component 210 provided across the circuit board 200.

Figure 4:
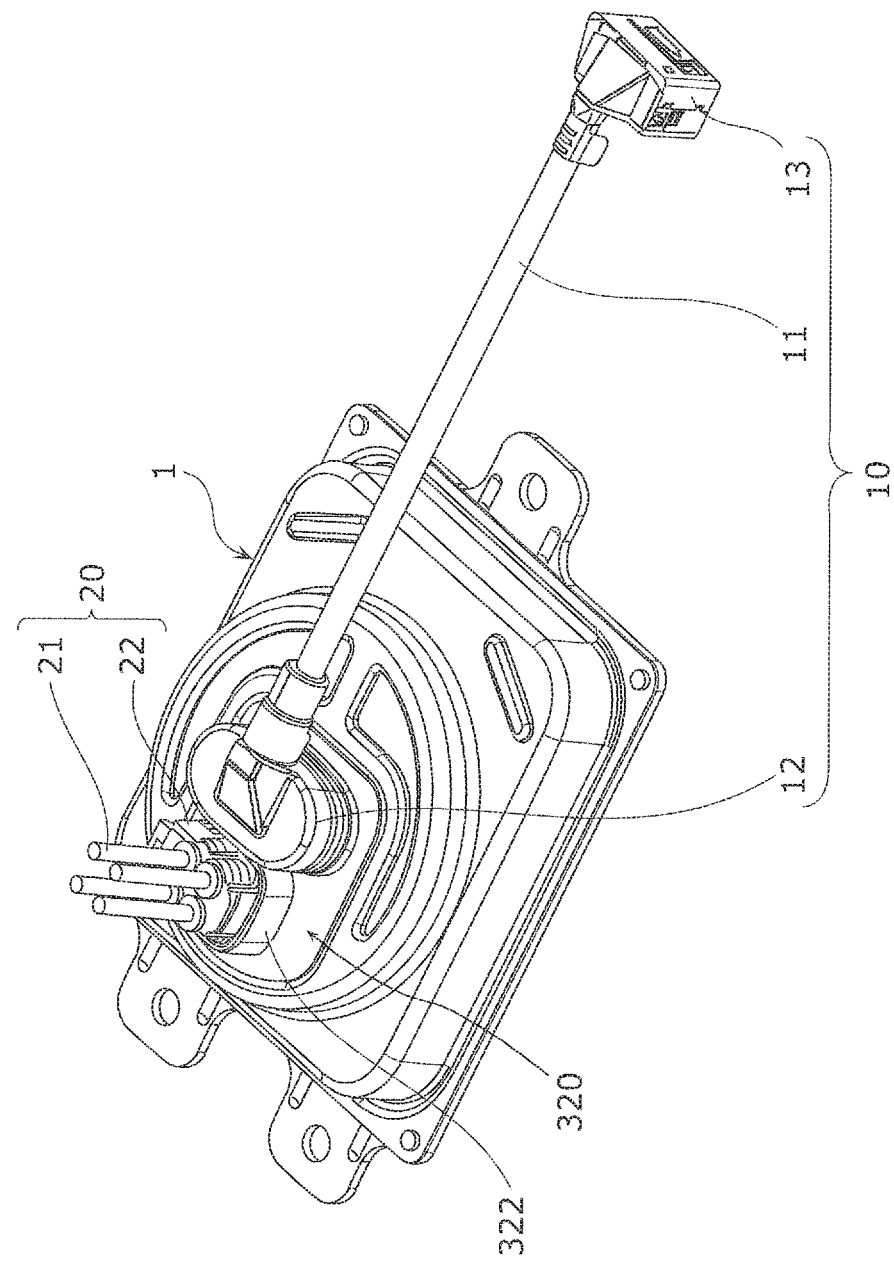
FIG. 4 is a diagram showing a state where an output harness and an input harness are connected to a power-supply device according to Embodiment 1.

Here, a case where an output harness 10 and an input harness 20 are connected to the power-supply device 1 in this embodiment will be described using FIG. 4. FIG. 4 is a diagram showing a state where the output harness 10 and the input harness 20 are connected to the power-supply device 1.

The output harness 10 is an external connector line for supplying output power of the power-supply device 1 to the discharge lamp device, and includes a cable 11, a first connector 12 provided at one end of the cable 11, and a second connector 13 provided at the other end of the cable 11, for instance.

The first connector 12 of the output harness 10 is an external connector connected to the power-supply device 1, and is a connector with a waterproof rubber grommet in this embodiment. Moreover, although not shown, the second connector 13 of the output harness 10 is electrically connected to the HID lamp in the discharge lamp device.

When the output harness 10 is connected to the power-supply device 1, the first connector 12 is connected to an output connector terminal 311a (internal connector) by being pushed into a coupler housing 320. With this, the output harness 10 and the output connector terminal 311a are electrically connected. In this case, the first connector 12 is closely attached to the coupler housing 320 to cover a first through hole 321 of the coupler housing 320. Accordingly, it is possible to ensure a waterproof property in the connection portion between the output harness 10 and the power-supply device 1.

In contrast, the input harness 20 is an external connector line for supplying input power to the power-supply device 1, and includes a cable 21 and a connector 22 provided at one end of the cable 21, for instance.

The connector 22 of the input harness 20 is an external connector connected to the power-supply device 1. Like the output harness 10, when the input harness 20 is connected to the power-supply device 1, the connector 22 is connected to an input connector terminal 311*b* (internal connector) by being pushed into the coupler housing 320. Specifically, the connector 22 is inserted through a second through hole 322 of the coupler housing 320 and connected to the input connector terminal 311*b* corresponding to the second through hole 322. With this, the input harness 20 and the input connector terminal 311*b* are electrically connected.

It is to be noted that although not shown, an other end of the input harness 20 is electrically connected to an external power source.

Figure 5A:
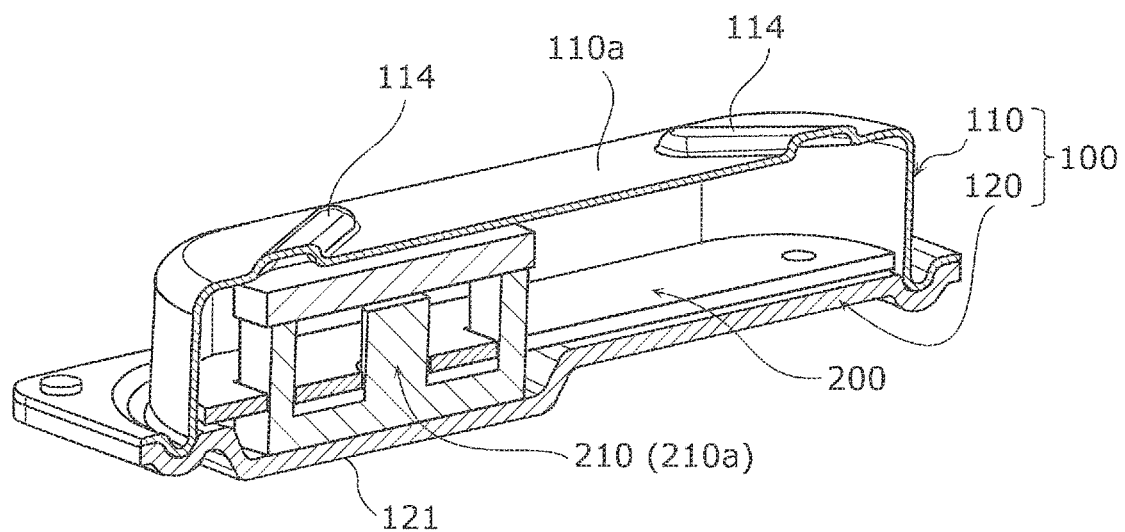
FIG. 5A is a cross-sectional view of a power-supply device according to Embodiment 1 at line A-A' in FIG. 3.
Figure 5B:
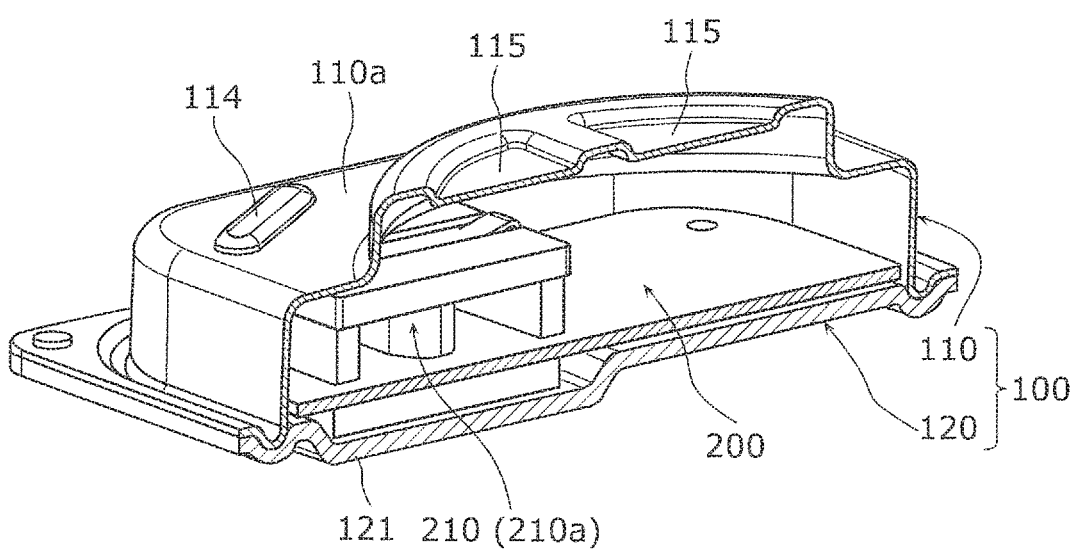
FIG. 5B is a cross-sectional view of a power-supply device according to Embodiment 1 at line B-B' in FIG. 3.

Hereinafter, the respective constituent components of the power-supply device 1 in this embodiment will be described in detail using FIG. 5A and FIG. 5B with reference to FIG. 1A, FIG. 1B, FIG. 2, and FIG. 3. FIG. 5A is a cross-sectional view of the power-supply device 1 at line A-A' in FIG. 3. FIG. 5B is a cross-sectional view of the power-supply device 1 at line B-B' in FIG. 3.

(Casing)

The casing 100 is a circuit case having a space therein, and is a press molded product formed by metal stamping. Here, the casing 100 has a thickness ranging from 0.3 to 3.0 mm. The casing 100 is formed to surround the circuit board 200.

In this embodiment, the casing 100 includes a casing portion 110 having an opening 111, and a cover portion (cover) 120 disposed to cover the opening 111 of the casing portion 110.

The casing portion 111 is a cover formed to cover the circuit board 200. The casing portion 110 is a metal cover, and is molded to have a space therein by performing metal stamping on a metal plate having a predetermined shape such as an aluminum plate and a stainless steel plate. In this embodiment, the casing portion 110 having a substantially box shape is molded by performing, for instance, press work on a metal plate having a thickness ranging from 0.3 to 3.0 mm.

It is to be noted that the metal plate used for the casing portion 110 is preferably thinner than the metal plate used for the cover portion 120, and may have a thickness ranging from 0.3 to 1.0 mm, for example. It is possible to easily perform press work by making the metal plate used for the casing portion 110 thinner in the above manner. As a result, it is possible to produce the casing portion 110 having a desired shape with high accuracy. Moreover, a material of the casing portion 110 is not limited to metal, but may be resin or the like.

The casing portion 110 includes a body portion 110*a* for mainly storing the circuit board 200, and an attaching portion 110*b* for mainly attaching the power-supply device 1 to an external device.

The body portion 110*a* is formed to cover the circuit board 200 entirely. The body portion 110*a* in this embodiment is substantially rectangular in planar view. With this, it is possible to reduce a waste of space in which the circuit board 200 is disposed.

The attaching portion 110*b* is a portion at which the power-supply device 1 is attached to a lamp housing (not shown) of the discharge lamp device, and is formed to protrude toward the lamp housing. Specifically, the attaching portion 110*b* is part of a top face of the body portion 110*a* that protrudes toward the lamp housing so that the part of the top face of the body portion 110*a* is fit in a hole of an attaching hole portion provided to the lamp housing. In other words, the attaching portion 110*b* is the part of the top face of the body portion 110*a* that protrudes outward. As stated above, by fitting the attaching portion 110*b* in the lamp housing, it is possible to increase a waterproof property in the connection portion between the casing portion 110 and the lamp housing.

In this embodiment, press work is performed on the attaching portion 110*b* so that the attaching portion 110*b* protrudes cylindrically, and a shape of the attaching portion 110*b* in planar view is substantially circular. With this, it is possible to further increase the waterproof property in the connection portion between the casing portion 110 and the lamp housing.

Moreover, since the attaching portion 110*b* is formed so that only the portion attached to the lamp housing protrudes in the casing portion 110, it is possible to suppress an increase in overall height of the casing portion 110. Accordingly, it can be intended to miniaturize the power-supply device 1.

A through hole 112 is formed in the attaching portion 110*b*. The through hole 112 is formed to penetrate a top face of the attaching portion 110*b*. In other words, the through hole 112 is surrounded by a wall portion that is a side wall of the attaching portion 110*b*.

Moreover, the through hole 112 is formed at a position corresponding to a connector terminal 311 connected to the circuit board 200, and is formed at a position opposite to the connector terminal 311 in this embodiment.

More specifically, the through hole 112 includes a first through hole 112*a* and a second through hole 112*b*. The first through hole 112*a* is opposite to the output connector terminal 311*a*, and the second through hole 112*b* is opposite to the input connector terminal 311*b*.

It is to be noted that a partition plate that partitions the first through hole 112*a* and the second through hole 112*b* is provided as part of the casing portion 110 to the top face of the attaching portion 110*b*. This partition plate is used as a ground connection terminal for the output harness 10 and the input harness 20 connected to the connector terminal 311.

Moreover, a groove 113 is formed in the attaching portion 110*b* of the casing portion 110 to surround the through hole 112. A seal material such silicone resin is applied to the groove 113. With this, the casing portion 110 and the coupler housing 320 are bonded together. In addition, the casing portion 110 and the coupler housing 320 can be sealed completely by circularly applying the seal material along the groove 113. With this configuration, it is possible to ensure a superior waterproof property in the connection portion between the lamp housing and the power-supply device 1. In addition, by forming the groove 113 in the attaching portion 110*b*, it is also possible to increase the stiffness of the top face of the attaching portion 110*b*.

Furthermore, in the casing portion 110, a non-flat portion is provided to a region (first region) having a size greater than or equal to outside diameters of the first connector 12 of the output harness 10 and the connector 22 of the input harness 20 that are connected to the connector terminal 311. In other words, in the region (first region) that is greater than or equal to the outside diameters of the first connector 12 of the output harness 10 and the connector 22 of the input harness 20 in the casing portion 110, the entire region will not become flat.

In this embodiment, the first region is a region defined by a circle having a diameter greater than or equal to φ15 mm, for instance. To put it another way, a non-flat portion is in the circular region defined by the circle having the diameter greater than or equal to φ15 mm. In short, the entire circular region will not become flat.

Specifically, the non-flat portion is provided in the first region by providing a protruding portion or a recess portion to a top face (i.e. the top face of the body portion 110*a* and the top face of the attaching portion 110*b*) of the casing portion 110.

More specifically, as shown in FIG. 2 and (b) of FIG. 3, two ridge portions 114 are provided to the top face of the body portion 110*a*. Moreover, two recess portions 115 are formed in the top face of the attaching portion 110*b* to surround part of the through hole 112. As shown in FIG. 5A and FIG. 5B, the ridge portions 114 and the recess portions 115 can be formed by performing press work or emboss on part of the metal plate included in the casing portion 110. Providing the ridge portions 114 and the recess portions 115 prevents the entire first region in the top face of the body portion 110*a* and the top face of the attaching portion 110*b* from becoming flat.

As stated above, by providing the non-flat portions in the region having the size greater than or equal to the outside diameters of the first connector 12 of the output harness 10 and the connector 22 of the input harness 20 in the casing portion 110, it is possible to increase the stiffness of the casing portion 110.

With this, when the first connector 12 of the output harness 10 or the connector 22 of the input harness 20 is fit in the connector terminal 311 by being pushed into the coupler 300 (a coupler base 310 and the coupler housing 320), or when the first connector 12 of the output harness 10 or the connector 22 of the input harness 20 is detached (pulled) from the coupler 300 (the coupler base 310 and the coupler housing 320) to be released from the connector terminal 311, it is possible to suppress exertion of stress (e.g. pressing force) per area on the flat portion of the casing portion 110, which is commensurate with stress exerted on the first connector 12 of the output harness 10 or the connector 22 of the input harness 20. Consequently, since it is possible to suppress deformation of the casing portion 110 due to the stress exerted when the output harness 10 or the input harness 20 is attached to or detached from the power-supply device 1, a power-supply device having a small housing (circuit case) with high stiffness can be realized.

In particular, since a rubber grommet (rubber cover) is provided to the first connector 12 of the output harness 10, when the first connector 12 is attached to the coupler housing 320, the rubber grommet is closely attached to the coupler housing 320 to cover the first through hole 321. In this case, the first connector 12 is strongly pushed into the coupler housing 320, and thus pressing force is strongly exerted on the top face of the attaching portion 110*b* of the casing portion 110. In addition, since the rubber grommet is closely attached to the coupler housing 320, when the first connector 12 is detached from the coupler housing 320, pulling force is also exerted on the top face of the attaching portion 110*b*.

In this embodiment, however, since the non-flat portion is provided in the first region of the casing portion 110, the casing portion 110 has high stiffness. Accordingly, even when strong stress (pressing force or pulling force) is exerted on the top face of the attaching portion 110*b* of the casing portion 110, the casing portion 110 will not be deformed.

It is to be noted that from a viewpoint of preventing deformation caused by stress exerted when the output harness 10 and the input harness 20 are attached or detached, a height of the ridge portions 114 and a depth of the recess portions 115 (i.e. a thickness of the non-flat portion) may be greater than or equal to a thickness of the metal plate included in the casing portion 110. More preferably, for example, when the metal plate included in the casing portion 110 has a thickness ranging from 0.3 to 3.0 mm, the height of the ridge portions 114 and the depth of the recess portions 115 may be greater than or equal to 1 mm.

The cover portion 120 is a substantially plate-like metal case body formed to cover the opening 111 of the casing portion 110. The cover portion 120 is molded into a predetermined shape by processing a metal plate such as an aluminum plate and a stainless steel plate. In this embodiment, the cover portion 120 having the predetermined shape is molded by performing press work on a metal plate having a thickness ranging from 0.3 to 3.0 mm.

It is to be noted that the metal plate used for the cover portion 120 is preferably thinner than the metal plate used for the casing portion 110, and may have a thickness ranging from 0.8 to 3.0 mm, for example. With this, it is possible to decrease thermal resistance in the cover portion 120, and thus it is possible to efficiently radiate heat given off from the electronic component 210. In other words, since the exterior of the cover portion 120 is exposed to the air when the power-supply device 1 is attached to the lamp housing, decreasing the thermal resistance in the cover portion 120 makes it possible to effectively radiate the heat given off from the electronic component 210.

The storage portion 121 for storing the electronic component 210 mounted on the circuit board 200 is provided to the cover portion 120. The storage portion 121 may store the whole or part of the electronic component 210.

The storage portion 121 is provided so that the storage portion 121 bulges outward from the casing 100, and is provided to a corner portion of the cover portion 120, for instance. As shown in FIG. 5A and FIG. 5B, the storage portion 121 stores, for example, part of a transformer 210*a* as the electronic component 210 provided across the circuit board 200. Specifically, the storage portion 121 stores a core of the transformer 210*a*. It is to be noted that when the electronic component 210 is provided on another face (reverse face) of the circuit board 200 which faces the cover portion 120, the storage portion 121 may store the electronic component provided to the reverse face of the circuit board 200.

Moreover, when the cover portion 120 is seen in a planar view, the storage portion 121 is provided at a position where the storage portion 121 does not overlap the through hole 112. Stated differently, when the cover portion 120 is seen in a planar view, the storage portion 121 and the through hole 112 do not overlap each other.

Since the through hole 112 is formed at the position corresponding to the connector terminal 311 connected to the circuit board 200, when the cover portion 120 is seen in a planar view, preventing the storage portion 121 and the through hole 112 from overlapping each other makes it possible to avoid an increase in partial thickness of the casing 100 that is caused by thick portions of the cover portion 120 and the casing portion 110 overlapping each other.

Furthermore, when the cover portion 120 is seen in a planar view, the storage portion 121 is preferably provided at a position where the storage portion 121 does not overlap the attaching portion 110*b*. Stated differently, when the cover portion 120 is seen in a planar view, the storage portion 121 and the side wall (wall portion) of the attaching portion 110*b* preferably do not overlap each other.

Since the storage portion 121 and the attaching portion 110b budge outward in opposite directions, when the storage portion 121 and the side wall (wall portion) of the attaching portion 110b overlap each other, the casing 100 increases in thickness. In view of this, preventing the storage portion 121 and the side wall of the attaching portion 110b from overlapping each other makes it possible to make the casing 100 thinner.

Moreover, a groove (seal groove) 122 is formed inside the cover portion 120 (for the circuit board 200) to surround the circuit board 200. The groove 122 is circularly formed along a periphery portion of the cover portion 120.

A seal material such silicone resin is applied to the groove 122. With this, the casing portion 110 and the cover portion 120 are bonded together. In this case, the casing portion 110 and the cover portion 120 can be sealed completely by circularly applying the seal material along the groove 122. With this configuration, it is possible to ensure a superior waterproof property in the connection portion between the casing portion 110 and the cover portion 120.

Moreover, forming the groove 122 makes it possible to increase the stiffness of the plate-like cover portion 120. Accordingly, it is possible to suppress exertion of mechanical stress on the circuit board 200 fixed to the cover portion 120.

Furthermore, the storage portion 121 may be provided at a position where the storage portion 121 is not connected to the groove 122. In other words, a recess portion of the storage portion 121 and a recess portion of the groove 122 do not communicate with each other, and the storage portion 121 and the groove 122 should not be formed continuously.

Moreover, a first protruding portion 123, a second protruding portion 124, a third protruding portion 125, and a through hole 126 are formed in the cover portion 120.

The first protruding portion 123 is provided at a position opposite to the coupler base 310. In this embodiment, the first protruding portion 123 is provided in three places around the central part of the cover portion 120 and opposite to protruding portions 314 of the coupler base 310.

The second protruding portion 124 is provided in the periphery portion of the cover portion 120. In this embodiment, the second protruding portion 124 is provided in three places in the periphery of and inside the groove 122.

The third protruding portion 125 is provided in the periphery portion of the cover portion 120. In this embodiment, the third protruding portion 125 is provided in one place in the periphery of a corner portion of and inside the groove 122. The third protruding portion 125 is formed into a stepped protruding shape. A tip portion of the third protruding portion 125 is inserted into the first through hole 201 formed in the circuit board 200, and a step face of the third protruding portion 125 abuts the reverse face of the circuit board 200 (the face facing the cover portion 120).

The first protruding portion 123, the second protruding portion 124, and the third protruding portion 125 support the circuit board 200. The first protruding portion 123 and the second protruding portion 124 have their tips in contact with the reverse face of the circuit board 200, and the third protruding portion 125 has its step face in contact with the reverse face of the circuit board 200 as stated above. Placing the circuit board 200 on the first protruding portion 123, the second protruding portion 124, and the third protruding portion 125 makes it possible to create a space between the circuit board 200 and the cover portion 120.

In this embodiment, the first protruding portion 123 and the second protruding portion 124 are substantially circular in planar view, and can be formed by performing emboss on the metal plate included in the cover portion 120, for instance. Moreover, the third protruding portion 125 that is stepped can be formed by processing the metal plate. A height of the first protruding portion 123 and the second protruding portion 124 and a first step height of the third protruding portion 125 are approximately 0.6 mm, for example.

The through hole 126 is formed at a position corresponding to the second through hole 202 of the circuit board 200 and a through hole 313 of the coupler base 310. A rivet 410 is inserted through the through hole 126.

Moreover, as shown in FIG. 1A and FIG. 1B, brackets 127 for attaching the power-supply device 1 to the lamp housing (not shown) are provided to the cover portion 120. A hole through which a bolt or a nut is inserted is provided to each of the brackets 127.

Furthermore, two reinforcement ribs are formed on each bracket 127. The ribs can be formed by performing emboss on the bracket 127, for instance. In this case, when recess portions on the back sides of the ribs communicate with the recess portion of the groove 122, there is a possibility that leakage of the seal material applied to the groove 122 to the ribs results in a space between the cover portion 120 and the casing portion 110, which decreases a waterproof property. Thus, the ribs of the brackets 127 may be formed separately from the groove 122.

(Circuit Board and Electronic Component)

As shown in FIG. 2, the circuit board 200 is a mounting board on which the electronic component 210 is mounted, and is, for instance, a PCB on which metal wiring having a predetermined pattern is formed. The circuit board 200 and the electronic component 210 constitute a circuit unit (electronic circuit).

The circuit board 200 is disposed in a space inside the casing 100. In this embodiment, the circuit board 200 is fixed to the cover portion 120. Specifically, the circuit board 200 is fixed to the cover portion 120 by being supported by protruding portions (the first protruding portion 123, the second protruding portion 124, and the third protruding portion 125) provided to the cover portion 120. By being placed on the protruding portions in this manner, the circuit board 200 is disposed away from the cover portion 120 by a space. With this, it is possible to suppress a short circuit of a conductive portion (metal wiring and via) on the reverse face of the circuit board 200 and the cover portion 120, and to ensure an insulation property between the circuit board 200 and the cover portion 120.

It is to be noted that silicone resin may be partially applied to part, of the space between the circuit board 200 and the cover portion 120, where heat of the circuit board 200 is great so that the part is in contact with the circuit board 200 and the cover portion 120.

Moreover, the first through hole 201, the second through hole 202, and a third through hole 203 are formed in the circuit board 200. The first through hole 201 is formed at a position corresponding to the third protruding portion 125 of the cover portion 120. The second through hole 202 is formed at a position corresponding to the through hole 126 of the cover portion 120 and the through hole 313 of the coupler base 310. The third through hole 203 is formed at positions corresponding to two of the three protruding portions 314 of the coupler base 310.

It is to be noted that the tip portion of the third protruding portion 125 of the cover portion 120 is fit in the first through hole 201. With this, it is possible to restrict the circuit board 200 to a horizontal movement.

The electronic component 210 mounted on the circuit board 200 is composed of circuit elements including the transformer 210a. It is to be noted that although FIG. 2 shows only the transformer 210a as the electronic component 210, electronic components other than the transformer 210a are mounted on the circuit board 200. Examples of the electronic components other than the transformer 210a include a resistor, a capacitor, a coil, a transistor, and a diode. These electronic components make up an electronic circuit such as a DC/DC converter and an inverter, for controlling lighting of an HID lamp.

It is to be noted that in this embodiment, although many of the electronic components are mounted on the face (surface) of the circuit board 200 which faces the casing portion 110, any low electronic component among the electronic components may be mounted on the other face (reverse face) of the circuit board 200 which faces the cover portion 120.

The transformer 210a in this embodiment is a sheet transformer, and includes, for instance, a winding pattern and a core (including E-shaped core and I-shaped core) formed in the circuit board 200. As shown in FIG. 2, FIG. 5A, and FIG. 5B, the transformer 210a is provided across the circuit board 200. Specifically, the transformer 210a is formed so that cores included in the transformer 210a sandwich the circuit board 200. In this embodiment, leg portions of the E-shaped core included in the transformer 210a are inserted through holes formed in the circuit board 200. Stated differently, the transformer 210a is formed by the E-shaped core and the I-shaped core sandwiching the circuit board 200.

It is to be noted that the core of the transformer 210a is not limited to a core of an EI type including the E-shaped core and the I-shaped core, but may be an EIR type core or a CI type core. Moreover, the E-shaped core and the I-shaped core of the transformer 210a may be fixed to each other with a plate spring or the like. Furthermore, a fixing spring may be inserted between the core and the circuit board 200 so that a wobble of the transformer 210a is suppressed and the transformer 210a is stably fixed to the circuit board 200.

(Coupler)

As shown in FIG. 2, the coupler 300 includes: the coupler base 310 mainly having a conducting function; and the coupler housing 320 mainly having a mechanical stress holding function and a waterproofing function. In this manner, it is possible to reduce a mounting space by separating the coupler 300 into two components depending on functions, and it can be intended to miniaturize the power-supply device 1.

The coupler base 310 and the coupler housing 320 are molded into a predetermined shape using a resin material. In this embodiment, the coupler base 310 is made of polyphenylene sulfide (PPS) resin, and the coupler housing 320 is made of polybutylene terephthalate (PBT) resin. A material having high heat resistance at a high melting point is preferably used as the material of the coupler base 310 so that the coupler base 310 resists heat generated at a time of reflow soldering. For this reason, in this embodiment, the material of the coupler base 310 is different from that of the coupler housing 320.

The coupler base 310 is for bundling connector terminals 311, and the connector terminals 311 are fixed to the coupler base 310. Each of the connector terminals 311 includes output connector terminals 311a and input connector terminals 311b. In other words, the output connector terminals 311a and the input connector terminal 311b are attached to the coupler base 310 all together.

The coupler base 310 is disposed on the face (surface) of the circuit board 200 which faces the casing portion 110. Moreover, the coupler base 310 is provided to a portion where the attaching portion 110b of the casing portion 110 is formed. In this embodiment, the coupler base 310 is provided opposite to the attaching portion 110b. With this, the connector terminals 311 attached to the coupler base 310 are provided to face the through hole 112 of the attaching portion 110b of the casing portion 110. To put it another way, the connector terminals 311 are disposed to the lamp housing (not shown) to which the attaching portion 110b is attached.

Specifically, the output connector terminals 311a are disposed to the face (surface) of the circuit board 200 which faces the casing portion 110, and are provided to protrude toward the first through hole 112a. In addition, the input connector terminals 311b are disposed to the face (surface) of the circuit board 200 which faces the casing portion 110, and are provided to protrude toward the second through hole 112b. Stated differently, as shown in (b) of FIG. 3, the output connector terminals 311a and the input connector terminals 311b can be visually recognized through the first through hole 112a and the second through hole 112b when the power-supply device 1 is viewed from top (seen in a planar view).

Each connector terminal 311 (each output connector terminal 311a and each input connector terminal 311b) is a conductive pin made of a metal material. The output connector terminal 311a and the input connector terminal 311b have one ends electrically connected to the metal wiring of the circuit board 200. In this embodiment, the one ends have a substantial L-shape formed by outwardly bending portions connected to the circuit board 200. The output connector terminal 311a and the input connector terminal 311b have the other ends connected to the first connector 12 of the output harness 10 and the connector 22 of the input harness 20, respectively.

The coupler base 310 in this embodiment includes a fixing portion 312 provided at a portion between the output connector terminal 311a and the input connector terminal 311b. The fixing portion 312 is provided to fix the coupler base 310, the circuit board 200, and the cover portion 120 (casing 100). With this configuration, it is possible to reduce stress in a solder connected portion of the connector terminal 311.

Specifically, a tip portion of the fixing portion 312 abuts the circuit board 200, and as shown in FIG. 2, the through hole 313 through which the fixing rivet 410 is inserted is formed in the fixing portion 312. The through hole 313 is formed to correspond to the second through hole 202 of the circuit board 200 and the through hole 126 of the cover portion 120.

As shown in FIG. 2, the cover portion 120, the circuit board 200, and the coupler base 310 are fixed using the rivet 410. Specifically, the rivet 410 is inserted through the through hole 126 of the cover portion 120, the second through hole 202 of the circuit board 200, and the through hole 313 of the coupler base 310, from outside the cover portion 120 via a spring washer 420. It is to be noted that using the spring washer 420 makes it possible to suppress an increase in conduction resistance caused by thinning of the circuit board 200. The rivet 410 is a blind rivet, for instance.

A protruding portion 314 that protrudes toward the circuit board 200 is provided to the coupler base 310. The protruding portion 314 is provided at a position opposite to the first protruding portion 123 of the cover portion 120, to sandwich the circuit board 200, and abuts the circuit board 200. Since the protruding portion 314 and the first protruding portion 123 have a function to reduce stress exerted on the coupler base 310, it is preferable that a plurality of the protruding portions 314 and a plurality of the first protruding portions 123 are provided. In this embodiment, three protruding portions 314 are provided. Moreover, it is preferable that the protruding portions 314 are provided in the periphery portion of the coupler base 310 to disperse stress. It is to be noted that the numbers of the protruding portions 314 and the first protruding portions 123 may be three to suppress a wobble of the circuit board 200.

It is to be noted that in this embodiment, tip portions of two of the three protruding portions 314 are formed into a stepped protruding shape. The tip portions are inserted into the third through holes 203 formed in the circuit board 200, and step faces of the two protruding portions 314 abut the surface of the circuit board 200 (face facing the casing portion 110). In addition, the remaining one protruding portion 314 has a tip portion that abuts the surface of the circuit board 200.

The first through hole 321 into which the first connector 12 of the output harness 10 is inserted and the second through hole 322 into which the connector 22 of the input harness 20 is inserted are formed in the coupler housing 320. The first through hole 321 and the second through hole 322 in the coupler housing 320 are inserted into the first through hole 112a and the second through hole 112b in the attaching portion 110b of the casing portion 110, respectively.

A flange portion 323 is provided to the coupler housing 320 to surround the first through hole 321 and the second through hole 322. The flange portion 323 is bonded to the groove 113 of the attaching portion 110b by a seal material.

Moreover, a seal component 330 is attached to the coupler housing 320. The seal component 330 is a connector seal and has a shape matching an inside wall of the second through hole 322 of the coupler housing 320. Specifically, the seal component 330 is a elastic body formed into a predetermined circular shape, and is attached to the inside wall of the second through hole 322. The seal component 330 is a silicone rubber, for example.

By attaching the seal component 330 to the second through hole 322, it is possible to completely seal the coupler housing 320 and the input harness 20 in the connection portion between the connector 22 of the input harness 20 and the input connector terminal 311b. With this configuration, it is possible to ensure a superior waterproof property in the connection portion between the coupler housing 320 and the input harness 20.

It is to be noted that as stated above, the waterproof property in the connection portion between the coupler housing 320 and the output harness 10 is ensured by the rubber grommet attached to the first connector 12.

(Summary)

As described above, according to the power-supply device 1 in this embodiment, the storage portion 121 is provided to the cover portion 120 of the casing portion 100 housing the circuit board 200 so that the storage portion 121 bulges outward from the casing 100, and the storage portion 121 stores the electronic component 210 such as a transformer provided across the circuit board 200.

With this configuration, even when the high electronic component 210 such as a transformer is provided to the circuit board 200 in the casing 100 formed by metal stamping or formed of a metal plate having a thickness ranging from 0.3 to 3.0 mm, it is only necessary to heighten a portion of the cover portion 120 which corresponds to the storage portion 121, and it is unnecessary to the heighten the casing portion 110. In other words, since the cover portion 120 that is, among the components included in the casing 100, a component opposite to the connector terminal 311 makes it possible to ensure a storage space for the high electronic component 210, it is possible to reduce the height of the casing portion 110 that is a component on the same side as the connector terminal 311 (i.e. the electronic component 210).

With this, it is possible to suppress the occurrence of the waste of space between the casing 100 and the electronic component 210, and thus it can be intended to miniaturize the casing 100 as a whole. Therefore, it is possible to realize a thin power-supply device.

It is to be noted that although the electronic component 210 stored in the storage portion 121 is an electronic component such as a transformer provided across the circuit board 200, the present invention is not limited to this. For instance, the same effect can be obtained when an electronic component provided to the face (reverse face) of the circuit board 200 which faces the cover portion 120, is stored in the storage portion 121.

Embodiment 2

Figure 6:
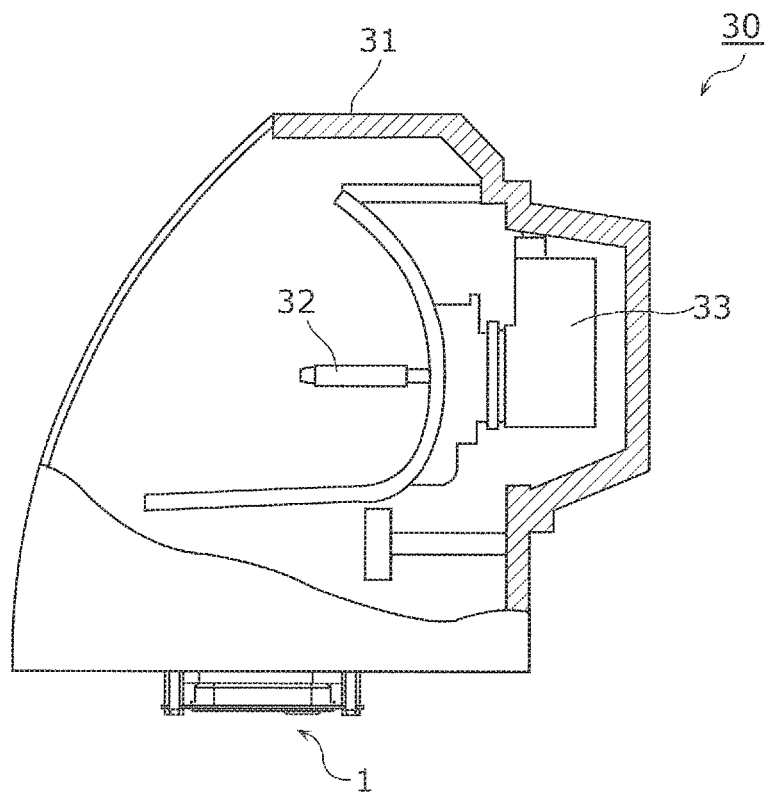
FIG. 6 is a cross-sectional view of a light fixture according to Embodiment 2.
Figure 7:
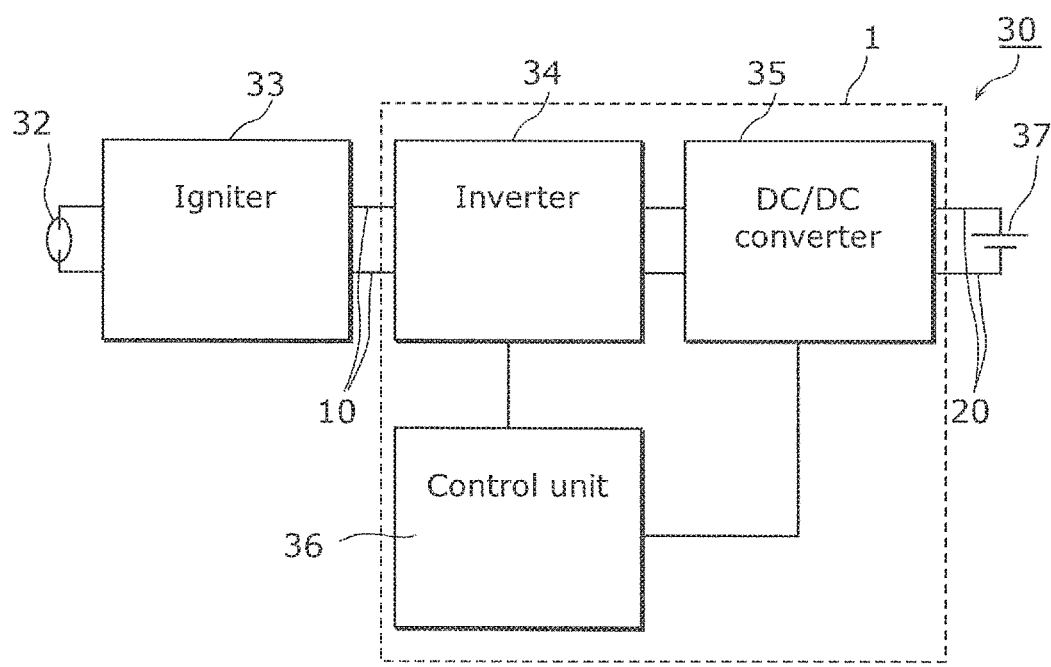
FIG. 7 is a block diagram showing a configuration of a light fixture according to Embodiment 2.

Next, a light fixture 30 according to Embodiment 2 will be described using FIG. 6 and FIG. 7. FIG. 6 is a cross-sectional view of the light fixture 30 according to Embodiment 2. FIG. 7 is a block diagram showing a configuration of the light fixture 30.

The light fixture 30 according this embodiment is a headlight in a vehicle such as an automobile, and, as shown in FIG. 6, includes: a housing (lamp housing) 31 having a light extraction portion; an HID lamp 32 that is a light source housed inside the housing 31; an igniter 33 with integrated socket for attaching the HID lamp 32; and the power-supply device 1 for controlling lighting of the HID lamp 32. The light extraction portion of the housing 31 is a translucent component that transmits and emits light from the HID lamp 32 to the outside, and is a translucent cover or a translucent panel, for example.

The power-supply device 1 thus configured is attached to the outside of the housing 31. Specifically, the power-supply device 1 is attached to the bottom of the housing 31. Though not shown, the power-supply device 1 and the igniter 33 are electrically connected via the output harness 10 or the like, and the power-supply device 1 supplies predetermined power to the HID lamp 32 via the igniter 33.

As shown in FIG. 7, in the light fixture 30, the power-supply device 1 includes, as a power supply circuit unit, an inverter 34, a DC/DC converter 35, and a control unit 36, and is connected to a power source 37 (e.g. direct-current power source such as a battery) via the input harness 20. Direct current power supplied from the power source 37 to the power-supply device 1 undergoes power conversion by the power-supply device 1, and an output of the inverter 34 is supplied to the igniter 33 via the output harness 10.

The igniter 33 generates a high voltage of several tens of kV for starting up the HID lamp 32, and causes the HID lamp 32 to start up by applying the high voltage to the HID lamp 32.

The inverter 34 is, for example, a full-bridge inverter that converts a direct current output voltage of the DC/DC converter 35 to a low-frequency square wave. Prior to the start up of the HID lamp 32, the inverter 34 supplies the igniter 33 with a voltage that causes the generation of a starting pulse.

The DC/DC converter 35 is, for example, a flyback DC/DC converter that raises or lowers the direct current voltage from the power source 37 to the voltage required by the HID lamp, by changing the ON time, drive frequency, or the like, of a switching element. The DC/DC converter 35 includes the transformer 210a in Embodiment 1.

The control unit 36 controls the DC/DC converter 35 so that the output power of the power-supply device 1 is at target power.

As stated above, the small power-supply device 1 in Embodiment 1 can be used for a light fixture of a vehicle or the like. Accordingly, it is possible to suppress an increase in size of the light fixture, and to realize a lightweight light fixture.

Figure 8A:
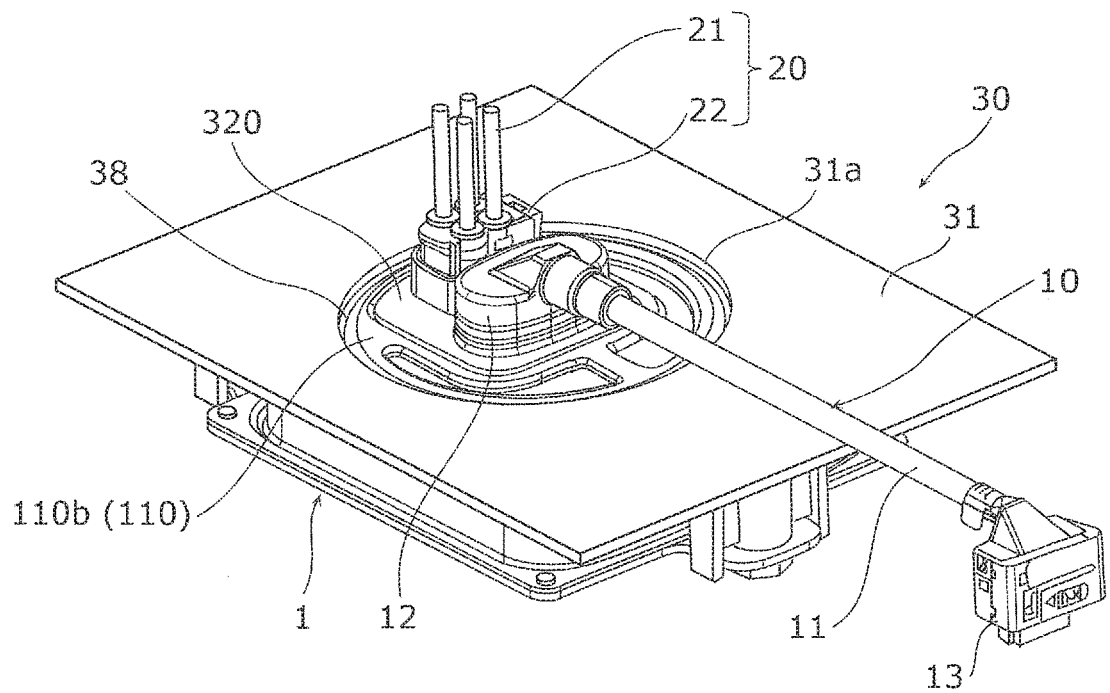
FIG. 8A is a perspective view when an attachment portion between a power-supply device according to Embodiment 1 and a housing of a light fixture according to Embodiment 2 is viewed obliquely from above.
Figure 8B:
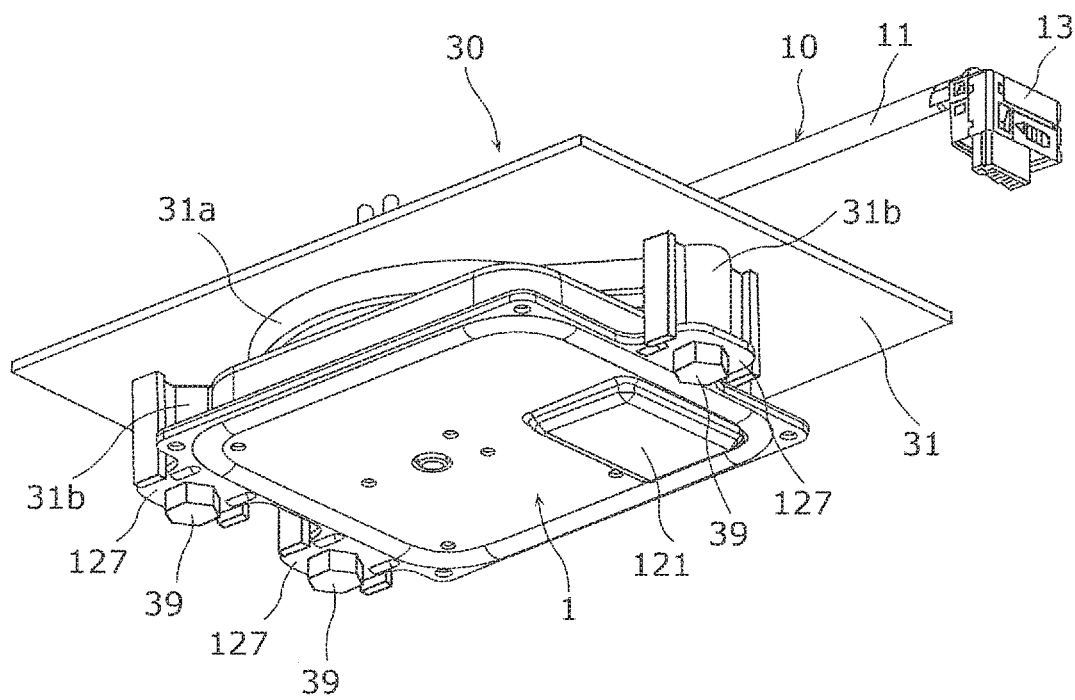
FIG. 8B is a perspective view when an attachment portion between a power-supply device according to Embodiment 1 and a housing of a light fixture according to Embodiment 2 is viewed obliquely from below.
Figure 9:
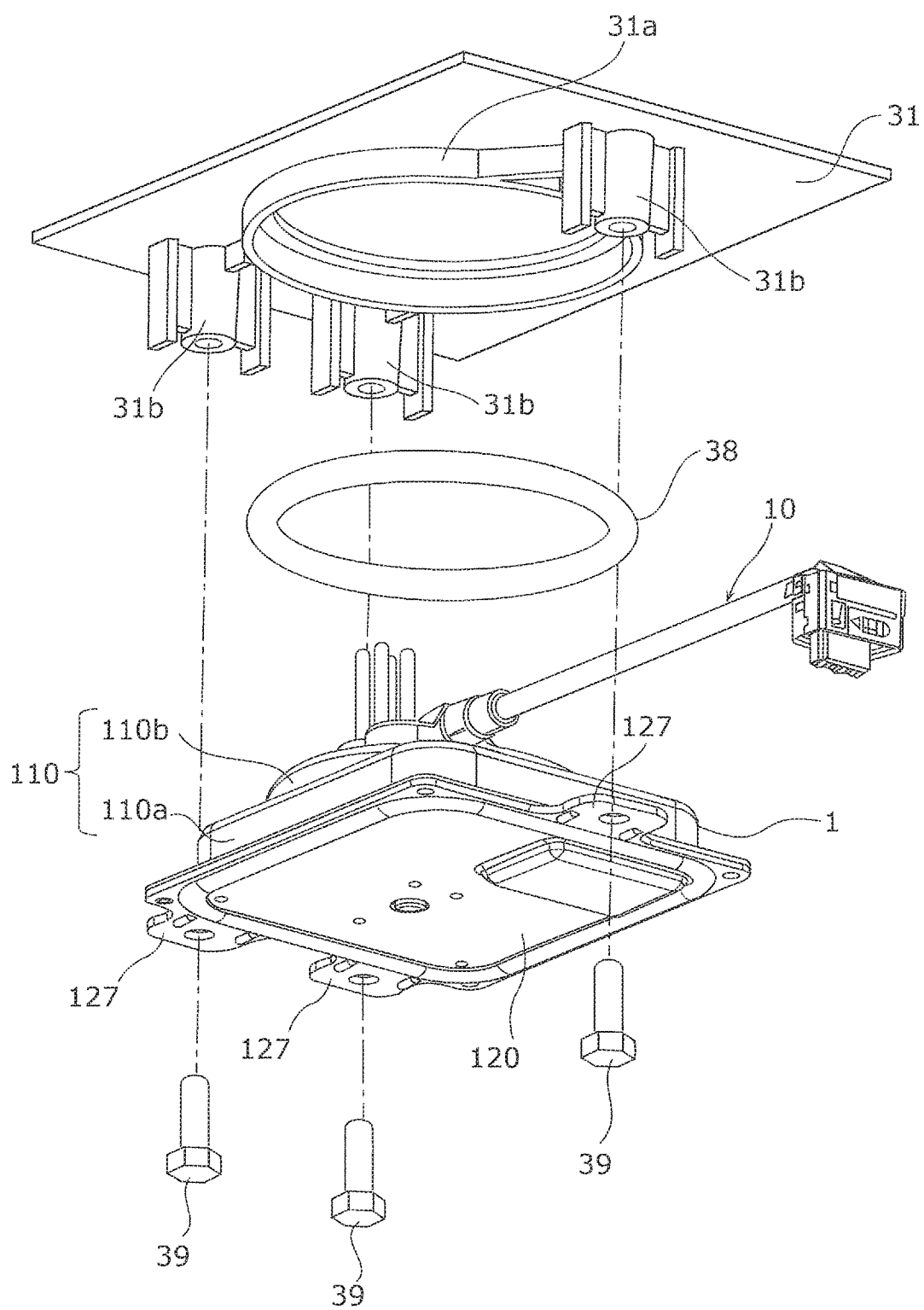
FIG. 9 is an exploded perspective view of a structure in an attachment portion between a power-supply device according to Embodiment 1 and a housing of a light fixture according to Embodiment 2.

Here, an attachment structure of the power-supply device 1 and the light fixture 30 will be described in detail using FIG. 8A, FIG. 8B, and FIG. 9. Each of FIG. 8A and FIG. 8B is a diagram for illustrating a structure of an attachment portion between the power-supply device 1 and the housing 31 of the light fixture 30. FIG. 8A is a perspective view when the attachment portion is viewed obliquely from above, and FIG. 8B is a perspective view when the attachment portion is viewed obliquely from below. FIG. 9 is an exploded perspective view of a structure in the attachment portion between the power-supply device 1 and the housing 31 of the light fixture 30. It is to be noted that FIG. 8A, FIG. 8B, and FIG. 9 show a portion of the bottom of the housing 31.

As shown in FIG. 8A, FIG. 8B, and FIG. 9, an attaching hole portion 31a for attaching the power-supply device 1 is provided to the bottom of the housing 31. The attaching portion 110b of the casing 100 in the power-supply device 1 is attached to the attaching hole portion 31a.

Moreover, three protruding portions 31b each having a hole into which a bolt 39 is inserted are formed at the bottom of the housing 31. Furthermore, three brackets 123 each having a hole through which the bolt 39 is inserted are formed in the cover portion 120 of the power-supply device 1.

When the power-supply device 1 is attached to the housing 31, the attaching portion 110b of the power-supply device 1 is attached to the hole of the attaching hole portion 31a. Specifically, the attaching portion 110b of the power-supply device 1 is fit in the hole of the attaching hole portion 31a via a resin O-ring 38. In this state, the three bolts 39 are inserted through the holes of the brackets 127 of the power-supply device 1 and into the holes of the protruding portions 31b of the housing 31, and the housing 31 and the power-supply device 1 are fastened and fixed with the bolts 39.

As stated above, it is possible to eliminate a space between the attaching portion 110b and the attaching hole portion 31a by fitting the attaching portion 110b and the attaching hole portion 31a via the O-ring 38. With this, it is possible to ensure a superior waterproof property in the connection portion between the power-supply device 1 and the housing 31.

It is to be noted that the headlight is described as an exemplary discharge lamp device in this embodiment, the power-supply device 1 may be applied to a discharge lamp device other than the headlight.

Embodiment 3

Figure 10:
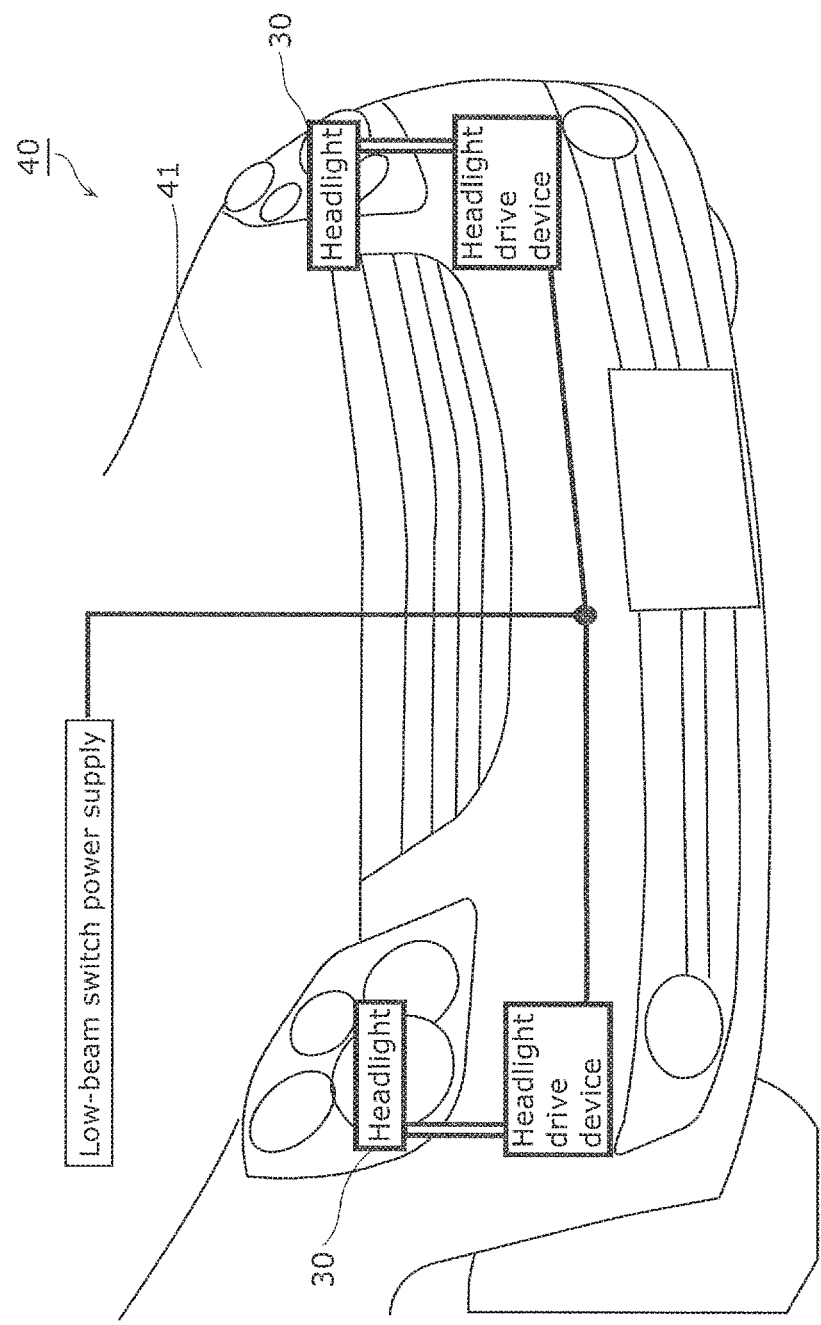
FIG. 10 is a block diagram showing a schematic configuration of a vehicle according to Embodiment 3.

Next, a vehicle 40 according to Embodiment 3 will be described using FIG. 10. FIG. 10 is a block diagram showing a schematic configuration of the vehicle 40 according to Embodiment 3.

As shown in FIG. 10, the vehicle 40 according to this embodiment is, for example, a four-wheeled automobile, and includes a vehicle body 41 and headlights that are light fixtures 30 attached to the vehicle body 41.

In recent years, engine room space is being reduced to secure more passenger room inside the automobile or for weight-reduction aimed at improving fuel consumption. Consequently, there is a demand for a smaller power-supply device. Since a light fixture using the power-supply device 1 in Embodiment 1 is small and lightweight, such a light fixture is useful for automobiles for which weight-reduction is required.

(Other Modifications, and so on)

Although the power-supply device, the light fixture, and the vehicle according to the disclosure have been described based on the embodiments, the present invention is not limited to the above-described embodiments.

Figure 11:
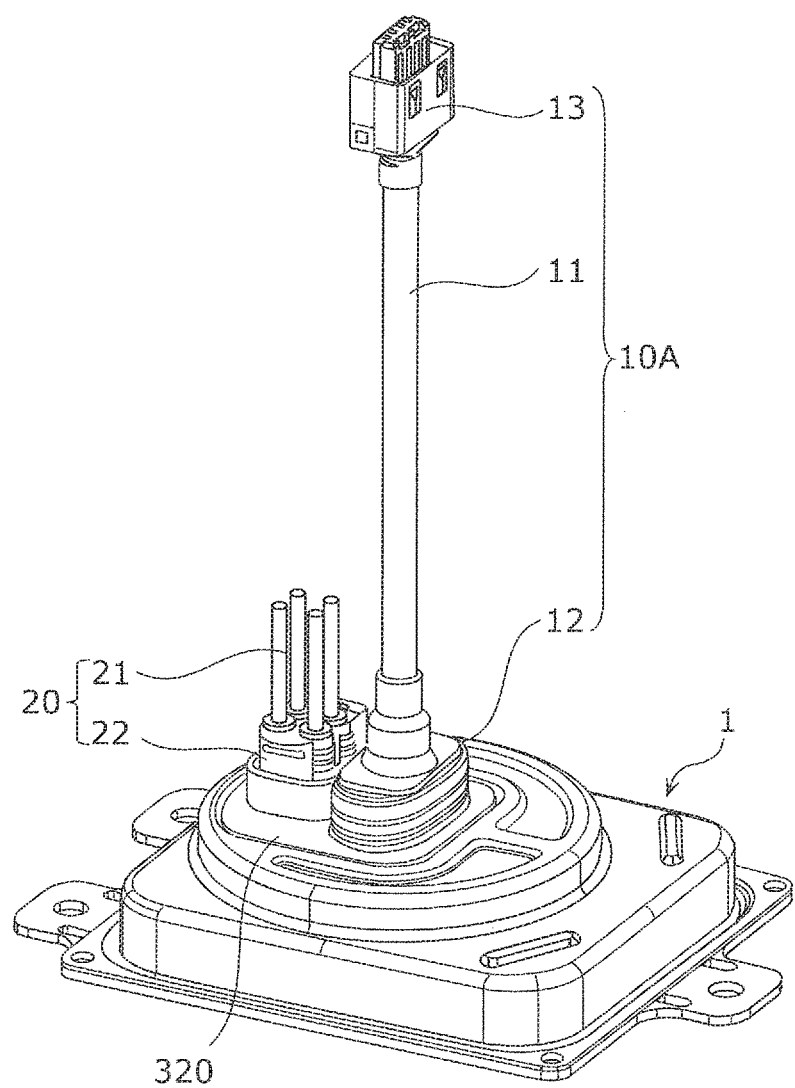
FIG. 11 is a diagram showing a state where another output harness and another input harness are connected to a power-supply device according to Embodiment 1.

For instance, although the output harness 10 of 90° type is used as shown in FIG. 4 in the embodiments, an output harness 10A of straight type may be used as shown in FIG. 11.

Moreover, although the cover portion 120, the circuit board 200, and the coupler base 310 are fixed using the rivet 410 in the embodiments, the cover portion 120, the circuit board 200, and the coupler base 310 may be fixed using a screw instead of the rivet 410. In this case, an insertion direction of the screw may be a direction from outside to inside of the casing 100 or a direction from inside to outside of the casing 100.

Furthermore, although the power-supply device 1 and the housing 31 are fixed using the bolts 39 in the embodiments, the power-supply device 1 and the housing 31 may be fixed using another fixing means.

Moreover, although the HID lamp is used as the light source in the embodiments, the light source is not limited to a discharge lamp, but may be a solid light emitting device such as a light emitting diode (LED) and an organic electro luminescence (EL) device. In other words, the power-supply device 1 may serve as a light source (load) to control lighting of a semiconductor light-emitting device such as an LED.

Forms obtained by various modifications to the exemplary embodiments and modifications that can be conceived by a person of skill in the art as well as forms realized by arbitrarily combining structural components and functions in the exemplary embodiments and modifications which are within the scope of the essence of the present invention are included in the present invention.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:
1. A power-supply device comprising:
   a casing;
   a circuit board; and
   at least one electronic component on the circuit board,
     wherein the casing includes a casing portion having an opening, and a cover portion disposed to cover the opening of the casing portion,
     the casing houses the circuit board between the casing portion and the cover portion, and the cover portion includes a recess covering the at least one electronic component, wherein the casing portion has a through hole formed at a position corresponding to a connector terminal connected to the circuit board, the casing portion includes a protruding portion that protrudes outward, a top face of the protruding portion is recessed, the through hole is located in the top face of the protruding portion.

2. The power-supply device according to claim 1, wherein the casing has a material thickness ranging from 0.3 to 3.0 mm.

3. The power-supply device according to claim 1, wherein the through hole is surrounded by a wall portion.

4. The power-supply device according to claim 3, wherein when the cover portion is seen in a planar view, the recess and the wall portion do not overlap each other.

5. The power supply device according to claim 1, wherein the at least one electronic component is a transformer.

6. The power supply device according to claim 1, wherein the cover portion has a thickness ranging from 0.8 to 3.0 mm, and the casing portion has a thickness ranging from 0.3 to 1.0 mm.

7. The power supply device according to claim 1, wherein the circuit board is fixed to the cover portion.

8. The power supply device according to claim 1, wherein a groove is formed in an inner face of the cover portion to surround the circuit board.

9. A light fixture comprising:
a housing including a light extraction portion;
a light source disposed inside the housing; and
the power-supply device according to claim 1 that is disposed outside the housing and supplies power to the light source.

10. The light fixture according to claim 9, wherein an exterior of the cover portion is exposed to an outside of the housing.

11. A vehicle comprising:
a vehicle body; and
the light fixture according to claim 9.

12. A power-supply device comprising:
a casing;
a circuit board; and
at least one electronic component on the circuit board, wherein the casing includes a casing portion having an opening, and a cover portion disposed to cover the opening of the casing portion, the casing houses the circuit board between the casing portion and the cover portion, and the cover portion includes a recess covering the at least one electronic component, wherein the casing portion has a through hole formed at a position corresponding to a connector terminal connected to the circuit board, the casing portion includes a wall portion provided by protruding part of the casing portion outward, the wall portion surrounds the through hole and is located away from the through hole, an external shape of the wall portion is circular in a plan view.

* * * * *